United States Patent
Xu et al.

(10) Patent No.: US 8,802,747 B2
(45) Date of Patent: Aug. 12, 2014

(54) NANOIMPRINT LITHOGRAPHY PROCESSES FOR FORMING NANOPARTICLES

(75) Inventors: Frank Y. Xu, Round Rock, TX (US); Sidlgata V. Sreenivasan, Austin, TX (US); Shuqiang Yang, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 472 days.

(21) Appl. No.: 13/017,259

(22) Filed: Jan. 31, 2011

(65) Prior Publication Data

US 2011/0190463 A1    Aug. 4, 2011
US 2014/0100346 A9    Apr. 10, 2014

Related U.S. Application Data

(63) Continuation-in-part of application No. 12/854,359, filed on Aug. 11, 2010.

(60) Provisional application No. 61/299,668, filed on Jan. 29, 2010, provisional application No. 61/236,957, filed on Aug. 26, 2009.

(51) Int. Cl.
*B29D 11/00*    (2006.01)
*C08F 20/06*    (2006.01)
*B23P 15/00*    (2006.01)
*B29C 35/08*    (2006.01)

(52) U.S. Cl.
USPC .......... 522/178; 526/317.1; 216/36; 977/773; 264/494

(58) Field of Classification Search
USPC .......... 526/317.1; 216/39; 977/773; 522/178; 264/494
See application file for complete search history.

(56) References Cited

U.S. PATENT DOCUMENTS 6,696,220 B2    2/2004    Bailey et al.
6,873,087 B1    3/2005    Choi et al.
6,918,946 B2    7/2005    Korgel et al.

(Continued)

FOREIGN PATENT DOCUMENTS

EP    2312393    4/2011
GB    2334347    8/1999

(Continued)

OTHER PUBLICATIONS

Glangchai et al., Nanoimprint lithography based fabrication of shape-specific, enzymatically-triggered smart nanoparticles; Journal of Controlled Release. 2008. vol. 125 pp. 283-272; Nov. 4, 2007.

(Continued)

*Primary Examiner* — Michael Pepitone
*Assistant Examiner* — Jessica Roswell
(74) *Attorney, Agent, or Firm* — Cameron A. King

(57) ABSTRACT

A lithography method for forming nanoparticles includes patterning sacrificial material on a multilayer substrate. In some cases, the pattern is transferred to or into a removable layer of the multilayer substrate, and functional material is disposed on the removable layer of the multilayer substrate and solidified. At least a portion of the functional material is then removed to expose protrusions of the removable layer, and pillars of the functional material are released from the removable layer to yield nanoparticles. In other cases, the multilayer substrate includes the functional material, and the pattern is transferred to or into a removable layer of the multilayer substrate. The sacrificial layer is removed, and pillars of the functional material are released from the removable layer to yield nanoparticles.

14 Claims, 9 Drawing Sheets

(56) References Cited

U.S. PATENT DOCUMENTS

| | | | |
|---|---|---|---|
| 6,936,194 | B2 | 8/2005 | Watts |
| 7,157,036 | B2 | 1/2007 | Choi et al. |
| 7,179,396 | B2 | 2/2007 | Sreenivasan |
| 7,396,475 | B2 | 7/2008 | Sreenivasan |
| 7,635,263 | B2 | 12/2009 | Cherala et al. |
| 7,635,445 | B2 | 12/2009 | Choi et al. |
| 7,636,999 | B2 | 12/2009 | Choi et al. |
| 7,705,237 | B2 | 4/2010 | Swanson |
| 7,759,407 | B2 | 7/2010 | Xu |
| 7,798,801 | B2 | 9/2010 | Babbs et al. |
| 2004/0065252 | A1 | 4/2004 | Sreenivasan et al. |
| 2004/0065976 | A1 | 4/2004 | Sreenivasan et al. |
| 2004/0178076 | A1 | 9/2004 | Stonas et al. |
| 2004/0211754 | A1 | 10/2004 | Sreenivasan |
| 2004/0241896 | A1 | 12/2004 | Zhou et al. |
| 2005/0187339 | A1 | 8/2005 | Xu et al. |
| 2006/0021967 | A1 | 2/2006 | Lee |
| 2006/0063387 | A1 | 3/2006 | Miller et al. |
| 2006/0172031 | A1 | 8/2006 | Babbs et al. |
| 2007/0031505 | A1 | 2/2007 | Roy et al. |
| 2008/0122106 | A1 | 5/2008 | Nitta et al. |
| 2008/0182070 | A1 | 7/2008 | Chou et al. |
| 2009/0061152 | A1 | 3/2009 | DeSimone et al. |
| 2009/0196826 | A1 | 8/2009 | Gao et al. |
| 2010/0120251 | A1 | 5/2010 | Sreenivasan et al. |
| 2011/0049096 | A1 | 3/2011 | Sreenivasan et al. |
| 2012/0114559 | A1 | 5/2012 | Singh et al. |

FOREIGN PATENT DOCUMENTS

| | | |
|---|---|---|
| WO | WO/02/29136 | 4/2002 |
| WO | WO/2007/081410 | 7/2007 |
| WO | WO/2007/094829 | 8/2007 |
| WO | WO/2008/106503 | 9/2008 |
| WO | WO/2009/014848 | 1/2009 |
| WO | WO/2011/025522 | 3/2011 |

OTHER PUBLICATIONS

PCT/US2011/023145 International Search Report, European Patent Office, Sep. 2, 2011.

Jang et al. Nanoscopic Pd Line Arrays Using Nanocontact Printed Dendrimers; Langmuir Mar. 28, 2006 American Chemical Society vol. 22 No. 7, pp. 3326-3331.

Hu et al. High-Moment Antiferromagnetic Nanoparticles with Tunable Magnetic Properties; Advanced Materials 2008, vol. 20 pp. 1479-1483.

Gratton et al. Nanofabricated particles for engineered drug therapies: a preliminary biodistribution study of Print nanoparticles.J Control Release. Aug. 16, 2007; vol. 121 pp. 10-18.

Kelly et al. Shape-specific monodisperse nano-molding of protein particles; J. Am. Chem. Soc. 2008, vol. 130, pp. 5437-5439 (Apr. 1, 2008).

Canelas et al. Top-down particles fabrication: control of size and shape for diagnostic imaging and drug delivery; WIREs Nanomedicine and Nanobiotechnology, 2009, vol. 1, pp. 391-404 (Jul. 1, 2009).

Hamidi et al. Hydrogel nanoparticles in drug delivery; Advanced Drug Delivery Reviews, vol. 60 (2008), pp. 1638-1649 (Sep. 20, 2008).

Hans et al. Biodegradable nanoparticles for drug delivery and targeting; Current Opinion in Solid State and Materials Science, 2002. 6(4): p. 319-327 (Sep. 4, 2002).

Hughes, Nanostructure-mediated drug delivery; Nanomedicine: nanotechnology, biology, and medicine, 2005. 1(1): p. 22-30 (Nov. 30, 2004).

Brigger et al. Nanoparticles in cancer therapy and diagnosis; Advanced Drug Delivery Reviews, May 10, 2002. 54 (5): p. 631-651.

Egitto, Plasma Etching and Modification of Organic Polymers; Pure and Applied Chemistry, 62:9 (1990) 1699-1708.

Kushida et al. Dry-Etching Durability of Copolymers and Polymer Blends of Vinylnaphthalene or α-Methylstyrene with Methyl Methacrylate; Japanese Journal of Applied Physics, 34:1:8A (1995) 4234-4238 (May 31, 1995).

Cho et al. Identification of Hydrophilic Group Formation on Polymer Surface during Ar+ Ion Irradiation in O2 Environment; Material Research Society Symposium Proceedings 438 (1997) 517-532.

Koh et al. Surface Modification of Polymer by Ion Assisted Reaction in Reactive Gases Environment; Material Research Society Symposium Proceedings 438 (1997) 505-510.

Hollander et al. On Depth Profiling of Polymers by Argon Ion Sputtering; Plasma Processes and Polymers, 4 (2007) 773-776.

Qui et al. Design and Evaluation of Layered Diffusional Matrices for Zero-Order Sustained-Release; Journal of Controlled Release, vol. 51, pp. 123-130, 1998 (May 30, 1997).

Qui et al. Design of a Core-Shelled Polymer Cylinder for Potential Programmable Drug Delivery; International Journal of Pharmaceutics, vol. 219, pp. 151-160, May 5, 2001.

Okuda et al. Time-programmed Dual Release Formulation by Multilayered Drug-loaded Nanofiber Meshes; Journal of Controlled Release, vol. 143, pp. 258-264 (Jan. 13, 2010).

Akita et al. Multilayered Nanoparticles for Penetrating the Endosome and Nuclear Membrane via a Step-wise Membrane Fusion Process; Biomaterials, vol. 30 (Mar. 4, 2009), pp. 2940-2049.

NANOIMPRINT LITHOGRAPHY PROCESSES FOR FORMING NANOPARTICLES

CROSS-REFERENCE TO RELATED APPLICATION

This application claims priority to U.S. Application Ser. No. 61/299,668 filed Jan. 29, 2010, which is incorporated by reference herein in its entirety; and is a continuation in part of U.S. application Ser. No. 12/854,359 filed Aug. 11, 2010; which claims the benefit under 35 U.S.C. §119(e)(1) of U.S. Provisional Application No. 61/236,957 filed on Aug. 26, 2009.

TECHNICAL FIELD

The present invention relates to a nanoimprint lithography process for forming nanoparticles.

BACKGROUND

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Application Publication No. 2004/0065976, U.S. Patent Application Publication No. 2004/0065252, and U.S. Pat. No. 6,936,194, all of which are hereby incorporated by reference herein.

An imprint lithography technique disclosed in each of the aforementioned U.S. patent application publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and the formable liquid applied between the template and the substrate. The formable liquid is solidified to form a layer that has a pattern conforming to a shape of the surface of the template that contacts the formable liquid. After solidification, the template is separated from the layer such that the template and the substrate are spaced apart.

SUMMARY

Nanoimprint lithography methods are used to form nanoparticles. In one aspect, a nanoimprint lithography method includes forming a patterned layer on a multilayer substrate, the multilayer substrate having a removable layer, and etching the patterned layer and portions of the multilayer substrate including the removable layer to transfer features from the patterned layer into the removable layer. The etched removable layer includes exposed protrusions and recessions. A polymerizable material is disposed on the etched removable layer to fill the recessions and to cover the protrusions of the etched removable layer. The polymerizable material is solidified to form pillars of the polymerized material in the recessions of the removable layer and to form a layer of polymerized material over the removable layer. A portion of the polymerized material is removed to expose the protrusions of the etched removable layer, and the pillars are released from the removable layer to form nanoparticles including the polymerized material.

In some implementations, forming the patterned layer on the multilayer substrate includes disposing a second polymerizable material on the multilayer substrate, contacting the second polymerizable material with a nanoimprint lithography template, and solidifying the second polymerizable material to form the patterned layer on the multilayer substrate. In certain implementations, solidifying the polymerizable material to form pillars of the polymerized material in the recessions of the removable layer and to form a layer of polymerized material over the removable layer includes contacting the polymerizable material with a nanoimprint lithography template and exposing the polymerizable material to ultraviolet radiation through the nanoimprint lithography template.

In another aspect, a patterned layer is formed on a multilayer substrate having a removable layer including removable material and a functional layer including functional material. As used herein, "functional material" generally refers to material which is not primarily used for its mechanical properties but for other properties, such as physical or chemical properties. Functional material may have uses within the bio-domain, the solar cell industry, the battery industry, and other areas. For example, functional material includes, but is not limited to, one or more biocompatible polymers, solar cell materials, polymerizable materials, and the like. Solar cell materials include, for example, n-type material and p-type material. Portions of the patterned layer and of the multilayer substrate are etched to expose at least a portion of the removable layer. The etched multilayer substrate includes multilayer protrusions capped with portions of the patterned layer. The portions of the patterned layer are removed from the multilayer protrusions to expose pillars including the functional material, and the pillars are released from the removable layer to form nanoparticles including the functional material.

In some implementations, forming the patterned layer on the multilayer substrate includes disposing a polymerizable material on the multilayer substrate, contacting the polymerizable material with a nanoimprint lithography template, and solidifying the polymerizable material to form the patterned layer on the multilayer substrate.

In certain implementations, the removable layer includes a water-soluble, non-toxic polymer. The removable layer can include a polymer with functional groups selected from the group consisting of carboxyl groups, nitrogen-containing groups, epoxide groups, hydroxyl groups, and polyethylene oxide groups. In some cases, the polymerizable material disposed on the etched removable layer is a functional material. The functional material can be biocompatible.

The nanoparticles may have a round, triangular, or rectangular cross-sectional shape. In some cases, dissolving the removable layer releases the pillars from the removable layer to form nanoparticles including the polymerized or functional material. A dimension of the nanoparticles can be less than 100 nm. Certain implementations include nanoparticles formed as described hereinabove.

Although methods and materials similar or equivalent to those described herein can be used in the practice or testing of the present embodiments, suitable methods and materials are described below. All publications, patent applications, patents, and other references mentioned herein are incorporated by reference in their entirety. In case of conflict, the present specification, including definitions, will control. The materials, methods, and examples are illustrative only and not intended to be limiting. It should be appreciated by those skilled in the art that the conception and the specific embodiments disclosed may be readily utilized as a basis for modifying or designing other structures for carrying out the same purposes as described herein. It should also be realized by those skilled in the art that such equivalent constructions do not depart from the spirit and scope as set forth in the appended claims.

DETAILED DESCRIPTION

Figure 1:
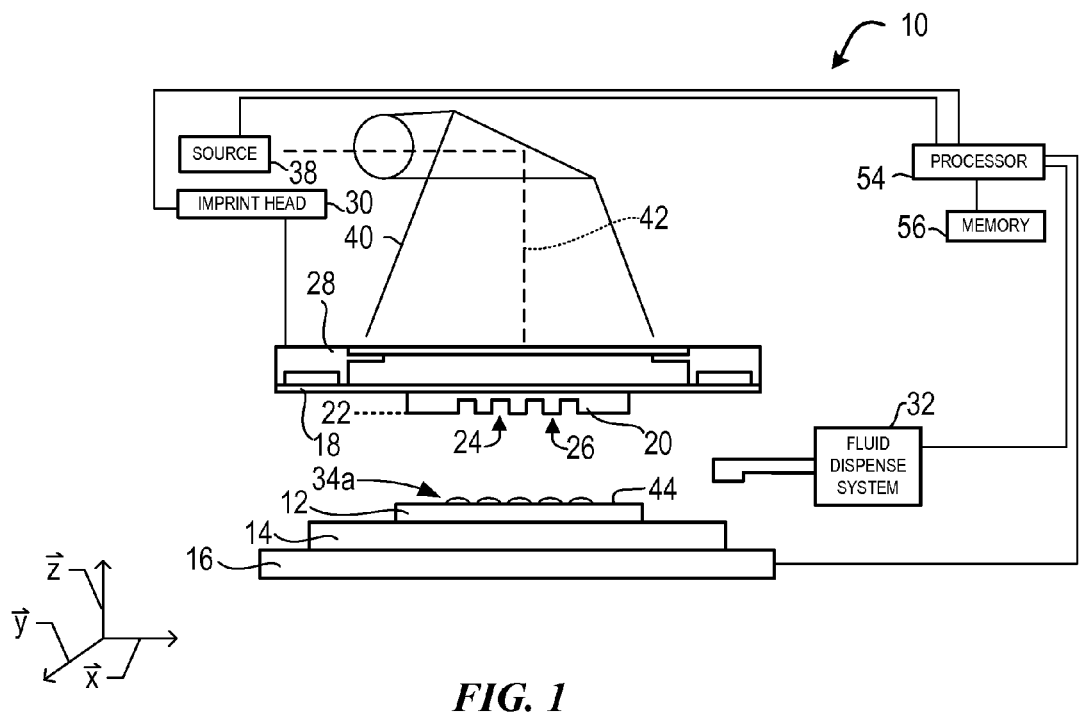
FIG. 1 illustrates a simplified side view of a lithographic system.
Figure 2:
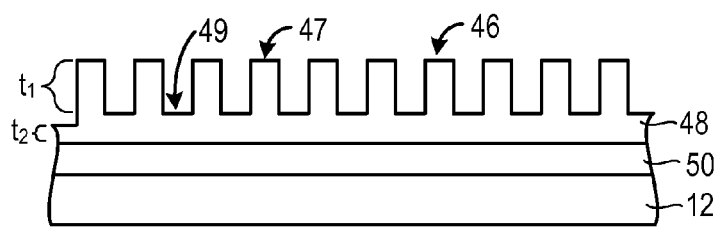
FIG. 2 illustrates a simplified side view of the substrate shown in FIG. 1 having a patterned layer positioned thereon.

Referring to the figures, and particularly to FIGS. 1 and 2, illustrated therein is a lithographic system 10 used to form functional nano- and/or microparticles on substrate 12. Substrate 12 may be coupled to substrate chuck 14. As illustrated, substrate chuck 14 is a vacuum chuck. Substrate chuck 14 however, may be any chuck including, but not limited to, vacuum, pin-type, groove-type, electrostatic, electromagnetic, and/or the like. Exemplary chucks are described in U.S. Pat. No. 6,873,087, U.S. Pat. No. 7,635,445, U.S. Patent Publication No. 2006/0172031, U.S. Pat. No. 7,636,999, and U.S. Pat. No. 7,635,263, all of which are incorporated by reference herein.

Substrate 12 and substrate chuck 14 may be further supported by stage 16. Stage 16 may provide rotational and/or translational motion in relation to the x, y and z axes. Stage 16, substrate 12, and substrate chuck 14 may also be positioned on a base (not shown). Spaced-apart from substrate 12 is template 18. Template 18 may include mesa 20 extending therefrom towards substrate 12, with mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments are not limited to such a configuration. For example, patterning surface 22 may be substantially flat. Generally, patterning surface 22 may be defined as any original pattern that forms the basis of a pattern to be formed on substrate 12. Additionally, template 18 may be treated with an anti-adhesion agent (e.g., RELMAT, available from Molecular Imprints, Inc., Austin, Tex., or (tridecafluoro-1,1,2,2-tetrahydrooctyl)trichlorosilane (FOTS)). Exemplary anti-adhesion agents include, but are not limited to those described in U.S. Pat. No. 6,696,220, which is incorporated by reference herein.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is incorporated by reference herein. Further, chuck 28 may be coupled to imprint head 30 such that chuck 28 and/or imprint head 30 may be configured to facilitate movement of template 18. Additionally, chuck 28 may be configured to adjust and/or vary the structure of template 18 prior to imprinting, during imprinting, and/or subsequent to imprinting (e.g. during separation).

System 10 may further include fluid dispense system 32. Fluid dispense system 32 may be used to deposit functional material 34a on substrate 12. Functional material 34a includes biocompatible materials (e.g., polyethylene glycol), materials used in solar cells (e.g., n-type material, p-type material) or batteries, and other materials that demonstrate desirable properties in nanoparticle form.

Functional material 34a may be positioned on substrate 12 using techniques such as drop dispense, spin-coating, dip coating, spray coating, chemical vapor deposition (CVD), physical vapor deposition (PVD), thin film deposition, thick film deposition, and/or the like. It should be noted that the positioning of functional material 34 on substrate 12 may be configured to limit the amount of waste. For example, use of drop dispense in positioning of functional material 34 on substrate 12, as compared to spin-coating and the like, may limit the amount of non-useable fluid during formation of functional nanoparticles.

Substrate 12 may include a removable layer 50. Removable layer 50 may facilitate separation of solidified functional material 34a from substrate 12 as described herein. Examples of materials for use in removable layer 50 may include, but are not limited to PVA and PMMA.

Referring to FIGS. 1 and 2, system 10 may further comprise solidification source 38 (e.g., energy source) coupled to direct a medium 40 (e.g., energy) along path 42 to solidify functional material 34a. Imprint head 30 and stage 16 may be configured to position template 18 and/or substrate 12 in superposition with path 42. System 10 may be regulated by processor 54 in communication with stage 16, imprint head 30, fluid dispense system 32 and/or source 38, and may operate on a computer readable program stored in memory 56.

Imprint head 30, stage 16, or both may vary a distance between mold 20 and substrate 12 to define a desired volume therebetween that is filled by functional material 34a. For example, imprint head 30 may apply a force to template 18 such that mold 20 contacts functional material 34a. After the desired volume is filled with functional material 34a, source 38 may produce medium 40, e.g. UV radiation, causing functional material 34a to solidify and/or cross-link conforming to a shape of surface 44 of substrate 12 and patterning surface 22, defining patterned layer 46 on substrate 12. Patterned layer 46 may comprise a residual layer 48 and/or features (e.g., protrusions 47 and recessions 49). Protrusions 47 may have a thickness $t_1$ and residual layer 48 may have a thickness $t_2$.

Figure 3:
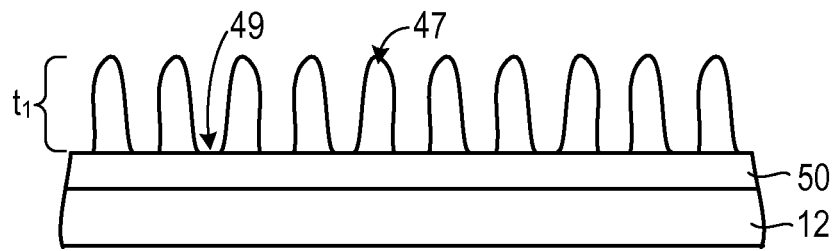
FIG. 3 illustrates a simplified side view of the substrate shown in FIG. 2 having multiple protrusions formed thereon.

Referring to FIGS. 2 and 3, after solidification, patterned layer 46 may be subjected to further processing to clean patterned layer 46 and/or further separate protrusions 47 to form pillars or nanoparticles 52. For example, patterned layer 46 may be subjected to an oxygen plasma etching. Etching may remove at least a portion (e.g., some or substantially all) of residual layer 48. FIG. 3 shows protrusions 47 on removable layer 50 after removal of substantially all of residual layer 48.

Figure 4:
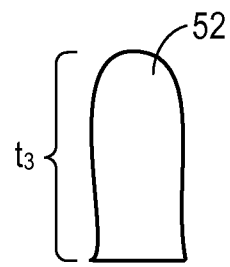
FIG. 4 illustrates a simplified side view of a pillar formed by release of the protrusions of FIG. 3.

Referring to FIGS. 3 and 4, release of protrusions 47 from substrate 12 may form pillars 52. For example, substrate 12 may be subjected to a solution that includes, but is not limited to, water (e.g., de-ionized water), organic solvents, inorganic acids (e.g., dilute HF), basic solutions, and/or the like. The solution may release protrusions 47 from substrate 12 to form pillars 52 having a thickness $t_3$.

Etching of protrusion 47 subsequent to solidification of functional material 34a may distort the configuration of protrusion 47 such that thickness $t_2$ of protrusion 47 is substantially different from thickness $t_3$ of the resulting pillar 52. The amount of degradation of shape may limit the accuracy and/or precision of dimensionality when forming pillars 52. Such distortion may be disadvantageous depending on the design consideration for pillar 52. For example, when pillars 52 are functional nanoparticles used as drug delivery devices, geo-targeting of destinations for pillar 52 within a body (e.g., human, animal, and/or the like) may be misdirected by alterations and/or distortion in shape.

Separation of template 18 from patterned layer 46 may also cause separation defects in pillars 52. Although release layers such as FOTS or RELMAT, and the like, may be provided on substrate 12, template 18, or both, the surface area of patterned layer 46 coupled to template 18 prior to separation may exceed the surface area of patterned layer 46 coupled to substrate 12. Materiality of release layers and/or functional material 34 in combination with the dynamics of the surface area may provide separation defects in pillars 52.

FIGS. 5A-5E illustrate schematic side views of formation of pillars 52a in a process selected to minimize degradation and separation distortion. By minimizing degradation and separation distortion, accuracy and/or precision of pillar formation may be controlled during the formation of functional nanoparticles (i.e., pillars 52a). Pillars 52a are formed of functional material 34a.

FIGS. 5A-5E illustrate the use of imprint lithography techniques to form functional nanoparticles while inhibiting degradation and separation distortion of the nanoparticles. Reducing the impact of degradation and separation distortion is achieved by designing the process to account for properties of the imprint lithography materials (e.g., sacrificial material, adhesive, and the like), properties of the functional materials, release properties of the template 18a and 18b, and/or the like), etc.

Figure 5A:
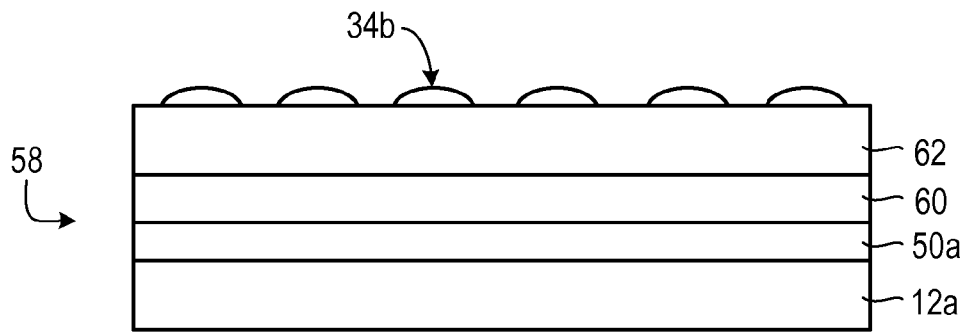
FIGS. 5A-5F illustrate simplified side views of formation of pillars by imprint lithography.
Figure 5B:
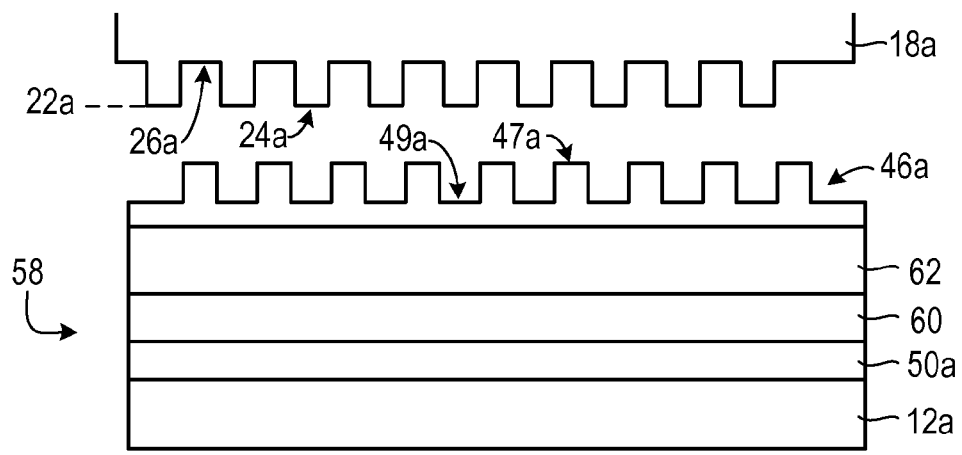
Figure 5C:
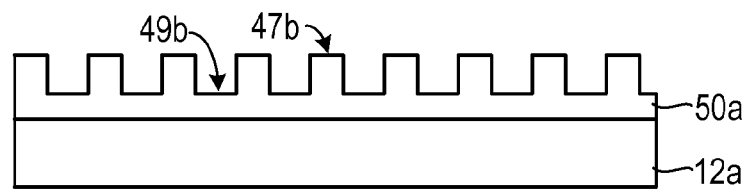
Figure 5D:
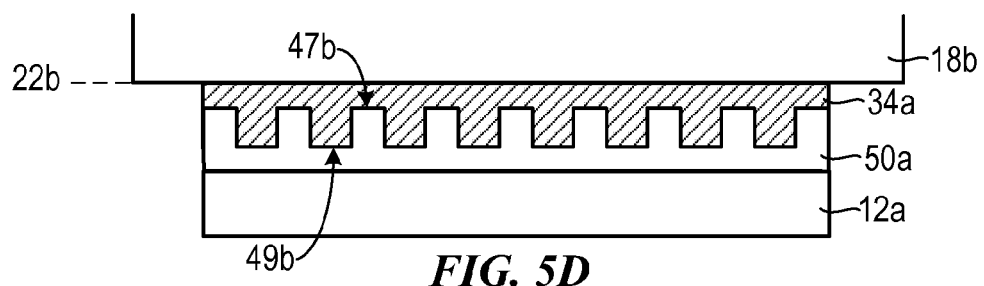
Figure 5E:
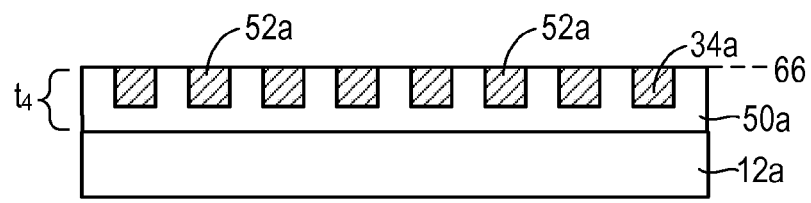

Pillars or nanoparticles 52a may be formed using one or more imprint lithography processes. As shown in FIGS. 5A and 5B, sacrificial material 34b may be used to form protrusions 47a and recessions 49a using template 18a through the processes and systems described in relation to FIGS. 1 and 2. For example, sacrificial material 34b (e.g., a polymerizable composition) may be solidified on a multilayer substrate 58 to form patterned layer 46a having a first set of protrusions 47a and recessions 49a. The pattern formed by protrusions 47a and recessions 49a may be used to form protrusions 47b and recessions 49b in removable layer 50a, as shown in FIG. 5C. Functional material 34a may then be deposited in recessions 49b in removable layer 50a to form pillars 52a, as shown in FIGS. 5D and 5E. In some cases, functional material 34a may be deposited on removable layer 50a and patterned by a second template 18b using the processes and systems as described in relation to FIGS. 1 and 2 to form pillars 52a in removable layer 50a. Pillars 52a may then be released from removable layer 50a to yield nanoparticles.

Referring to FIG. 5A, sacrificial material 34b may be deposited on multilayer substrate 58. Sacrificial material 34b may be formed of materials including, but not limited to, a polymerizable fluid comprising a monomer mixture as described in U.S. Pat. No. 7,157,036 and/or U.S. Patent Publication No. 2005/0187339, both of which are incorporated by reference herein.

Multilayer substrate 58 may include a base layer 12a, a removable layer 50a, a protection layer 60 and an adhesion layer 62. Base layer 12a may be similar to substrate 12 described with respect to FIG. 1. Base layer 12a may be formed of materials including, but not limited to, fused-silica, quartz, silicon, organic polymers, siloxane polymers, borosilicate glass, fluorocarbon polymers, metal, hardened sapphire, and/or the like.

Removable layer 50a may be positioned adjacent to base layer 12a. Removable layer 50a may be similar to removable layer 50 described with respect to FIG. 3. For example, removable layer 50a may release pillars 52a when subjected to a solution including, but not limited to, water (e.g., de-ionized water), organic solvents, inorganic acids (e.g., dilute HF), basic solutions, and/or the like.

In some cases, removable layer 50a may be biocompatible. For example, when functional material 34a is a biomaterial used to form bioparticles, such as a drug delivery device, materials in contact with functional material 34a, such as removable layer 50a, may be water-soluble and non-toxic. Water-soluble, non-toxic substances that can be used in removable layer 50a can include, for example, polymers with carboxyl groups (e.g., poly(acrylic acid) (PAA), poly(methacrylic acid) (PMA), and the like), polymers with nitrogen in a side chain and/or as part of the backbone of the polymer (e.g., polyvinylpyrrolidone (PVP), poly[2-methacryloyloxy) ethyl phosphorylcholine] (PMPC), poly(N-isopropylacrylamide) (PNIPAAm), and poly[N-(2-hydroxypropyl) methacrylamide] (PHPMA), and the like), polymers with carboxyl groups and with nitrogen in a side chain and/or as part of the backbone of the polymer (e.g., poly(N,N-dimethylacrylamide-co-acrylic acid) (PDAm-co-PAA), and the like), and polymers with hydroxyl and polyethylene oxide groups (e.g., poly(vinyl alcohol) (PVA), polyethylene glycol (PEG), and the like).

The carboxyl groups in the non-toxic, water-soluble polymers allow polar interaction between the polymer and water, thus enhancing solubility of the polymer in water. As such, water may be used advantageously to dissolve removable layer 50a, and to wash the resulting functional nanoparticles. The carboxyl groups also interact with functional material 34a, thus promoting adhesion between the functional material and the removable layer during processing of the functional nanoparticles. For example, a biocompatible functional material 34a may include water-compatible polymeric material, such as acrylates and methacrylates (e.g., PEG acrylate) with one or more polar functional groups, as a binder for an active substance. Biocompatible functional material 34a may also include other polar components, such as acrylic acid, methacrylic acid, compounds with epoxy, vinyl ether, and/or thiol groups, and the like, that are capable of polymerizing and binding biocompatible particles to form cylinders 52a in removable layer 50a. The polymerizable material in the functional material may also form interactions with functional groups exposed at a surface of removable layer 50a during polymerization of the functional material 34a, thus improving adhesion of the functional material 34a to the removable layer 50a. Carboxyl groups in removable layer 50a also improve wettability of the removable layer (including, for example, recesses 47b) by a water-based functional material 34a to allow more efficient filling of recesses 47b with functional material 34a.

As shown in FIGS. 5A and 5b, protection layer 60 may be positioned adjacent to removable layer 50a. The composition of protection layer 60 may be selected to minimize damage and/or distortion of removable layer 50a during imprinting and/or etching. For example, protection layer 60 may be formed of materials such as PECVD silicon oxide and the like.

Adhesion layer 62 may be positioned adjacent to protection layer 60. Adhesion layer 62 may be formed of a composition described in U.S. Pat. No. 7,759,407, which is incorporated by reference herein. During processing of patterned layer 46a, adhesion layer 62 may help minimize separation distortion by adhering patterned layer 46a to multilayer substrate 58 during separation of template 18 from patterned layer 46a.

Referring to FIG. 5B, features (e.g., 47a and 49a) of patterned layer 46a may be formed on multilayer substrate 58 using first template 18a as described in relation to the system 10 and processes described in FIGS. 1 and 2. It should be noted that patterned layer 46a may be formed by other nanolithography techniques including, but not limited to, optical lithography, x-ray lithography, extreme ultraviolet lithography, scanning probe lithography, atomic force microscopic nanolithography, magneto lithography, and/or the like.

Referring to FIGS. 5C-5D, subsequent to formation of patterned layer 46a on multilayer substrate 58, features in patterned layer 46a (e.g., 47a and 49a) may aid in forming features in removable layer 50a (e.g., 47b and 49b). For example, features (e.g., 47b and 49b) may be etched in multilayer substrate 58 forming features (e.g., 47b and 49b) in removable layer 50a. Exemplary techniques include, but are not limited to, techniques described in U.S. Pat. No. 7,179,396 and U.S. Pat. No. 7,396,475, both of which are incorporated by reference herein.

Referring to FIGS. 5D and 5E, functional material 34a (e.g., biomaterial) may be deposited on patterned removable layer 50a. Functional material 34a may be deposited using techniques such as drop dispense, spin-coating, dip coating, chemical vapor deposition (CVD), physical vapor deposition (PVD), thin film deposition, thick film deposition, and/or the like depending on design considerations. For example, by depositing functional material 34a using drop dispense techniques, the amount of functional material 34a deposited on removable layer 50a may be conserved.

Functional material 34a may fill in recessions 49b in removable layer 50a, forming pillars 52a. In one embodiment, portions of functional material 34a deposited on removable layer 50a may be removed to form pillars 52a. Removal of portions of functional material 34a provides a crown layer 66 (e.g., substantially planar layer) exposing pillars 52a. Portions of functional material 34a may be removed using techniques including, but not limited to, blanket etching, chemical-mechanical planarization, and/or similar methods. For example, if functional material 34a is formed of metal, crown layer 66 may be formed by metal etchants including, but not limited to, Cl2, BCl3, other chlorine-containing etchants, and/or the like. It should be noted that the metal etchants are not limited to chlorine-containing etchants. For example, some metals, such as tungsten, may be etched using fluorine-containing etchants. Crown layer 66 may be formed by etching using an imprinting resist as a mask or by using a hard mask for pattern transfer. For example, crown layer 66 may be formed by using a hard mask formed of materials including, but not limited to, Cr, silicon oxide, silicon nitride, and/or the like. In some cases, if functional material 34a is formed of silicon-containing material, crown layer 66 may be etched using common silicon etchants including, but not limited to, $CF_4$, $CHF_3$, $SF_6$, $Cl_2$, HBr, other fluorine-, chlorine-, and bromine-containing etchants, and/or the like. In certain cases, crown layer 66 may be etched using an imprint resist as a mask, a hard mask for pattern transfer, or the like. For example, crown layer 66 may be etched using a hard mask formed of materials including, but not limited to, Cr, silicon oxide, silicon nitride, and/or the like.

In some embodiments, a second template 18b may be used to form pillars 52a from functional material 34a deposited on removable layer 50a. Template 18b may be positioned in superimposition with functional material 34a on removable layer 50a. Template 18b may contact functional material 34a, and functional material 34a may be solidified. Template 18b may then be separated from solidified functional material 34a. Template 18b may optionally include a coating (e.g., a release coating such as FOTS) that aids in separation of template 18b from solidified functional material 34a as described herein.

Template 18b may form a substantially planar surface or edge on solidified functional material 34a. The surface area between solidified functional material 34a and template 18b may be selected such that it is less than the surface area between solidified functional material 34a and removable layer 50a. For example, template 18b may be substantially planar. By reducing the surface area of solidified functional material 34a and template 18b as compared to the surface area of solidified functional material 34a and removable layer 50a, separation defects of solidified functional material 34a may be reduced.

Referring to FIG. 5E, solidified functional material 34a and/or removable layer 50a may be removed to provide a crown layer 66. For example, solidified functional material 34a and/or removable layer 50a may be removed by blanket etching, CMP polishing, and/or similar methods to provide crown layer 66 (e.g., planarized layer). Pillars 52a may be positioned in recesses 49b of removable layer 50a.

Figure 5F:
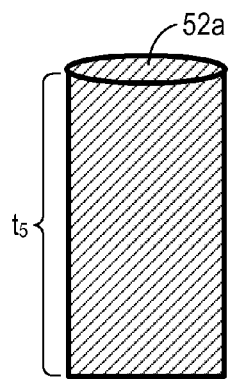

Referring to FIGS. 5E and 5F, pillars 52a may be released from removable layer 50a. For example, removable layer 50a may be subjected to a solution including, for example, water (e.g., de-ionized water), organic solvents, inorganic acids (e.g., dilute HF), basic solutions, and/or the like, causing pillars 52a to be released from the removable layer.

Figure 6A:
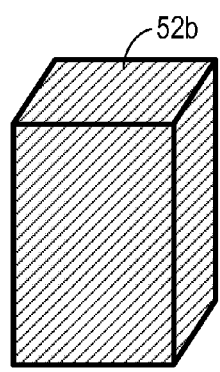
FIGS. 6A-6C illustrate perspective views of exemplary pillars.
Figure 6B:
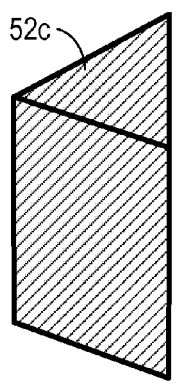
Figure 6C:
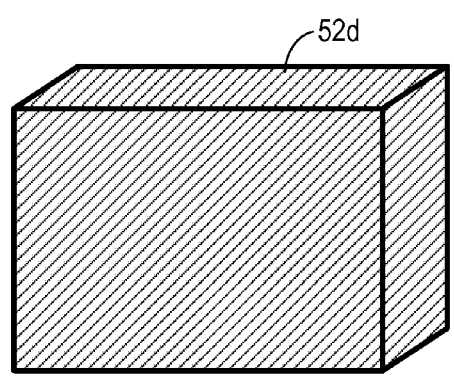

Dimensions provided by the crowning of solidified functional material 34a and the dimensions provided by removable layer 50a may define surfaces or edges of pillars 52a, and as such, the volume of pillars 52a. By adjusting these dimensions, pillars 52a may be constructed having varying shapes and sizes. For example, as illustrated in FIGS. 6A-6C, pillars 52b, 52c, and 52d may be constructed in shapes including, but not limited to, circular, triangular, rectangular, fanciful, and the like. By controlling the dimensions of removable layer 50a and planarization of solidified functional material 34a, shape, accuracy, and precision of formation of pillars 52a may also be controlled. Further, pillars 52a may be formed using exemplary techniques described in U.S. Patent Publication No. 2010/0120251, which is incorporated by reference herein.

Figure 7:
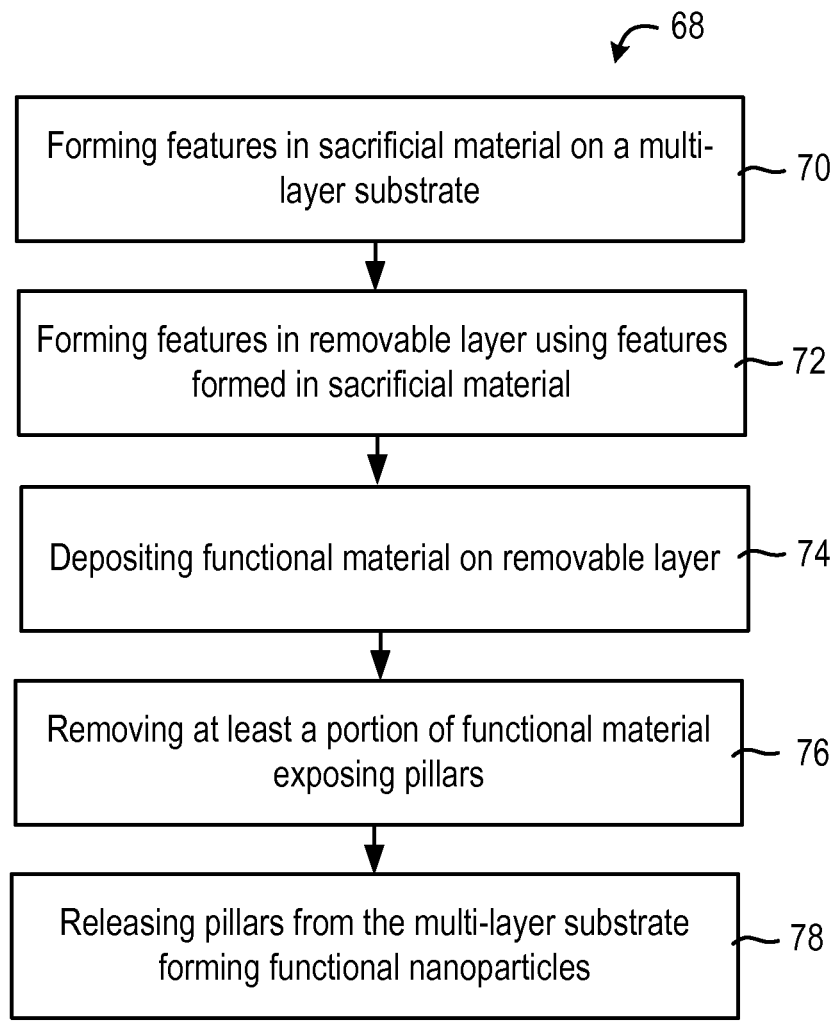
FIG. 7 is a flow chart showing steps in method of forming pillars using imprint lithography.

FIG. 7 illustrates a flow chart of a method 68 for forming pillars or nanoparticles 52a using an imprint lithography system. Formation of pillars 52a may include one or more lithography steps (e.g., nanoimprint lithography). In step 70, sacrificial material 34b may be patterned on a multilayer substrate 58. For example, sacrificial material 34b may be patterned using a first imprint lithography process using first template 18a to provide patterned layer 46a having features 47a and 49a. In step 72, features 47a and 49a may be used to form features 47b and 49b in removable layer 50a. For example, features 47a and 49a may be etched into multilayer substrate 58 to provide features 47b and 49b in removable layer 50a. In step 74, functional material 34a (e.g., biomaterial) may be deposited on removable layer 50a and solidified. In step 76, a portion of functional material 34a may be patterned and/or removed to provide crown surface 66 exposing pillars 52a. In step 78, pillars 52a may be released from multilayer substrate 58.

FIGS. 8A-8E illustrate simplified side views of an embodiment for forming pillars or nanoparticles 52b. Formation of pillars 52b may include one or more imprint lithography steps.

Figure 8A:
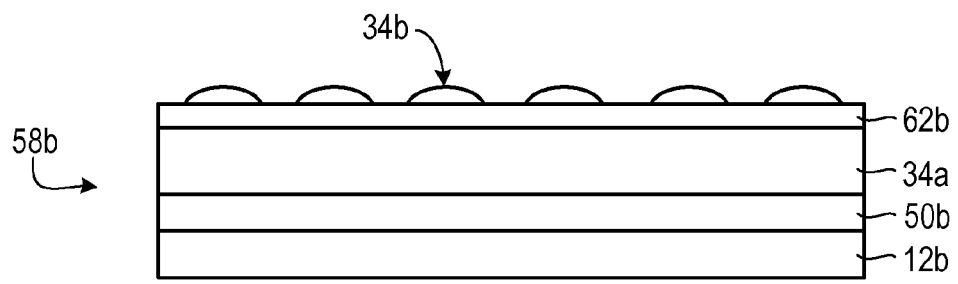
FIGS. 8A-8E illustrate simplified side views of formation of pillars by imprint lithography.

Referring to FIG. 8A, sacrificial material 34b may be deposited on multilayer substrate 58b. Sacrificial material 34b may be formed of materials including, but not limited to, a polymerizable fluid comprising a monomer mixture as described in U.S. Pat. No. 7,157,036 and U.S. Patent Publication No. 2005/0187339, both of which are incorporated by reference herein.

Multilayer substrate 58b may include base layer 12b, removable layer 50b, functional layer 34a, and adhesion layer 62b. Base layer 12b may be similar to substrate 12 described with respect to FIG. 1. For example, base layer 12b may be formed of materials including, but not limited to, fused-silica, quartz, silicon, organic polymers, siloxane polymers, borosilicate glass, fluorocarbon polymers, metal, hardened sapphire, and/or the like. Removable layer 50b, functional layer 34a, and adhesion layer 62b may be formed of materials similar to those described with respect to FIGS. 5A-5E.

Removable layer 50b may be positioned adjacent to base layer 12b. Removable layer 50b may have properties similar to those of removable layer 50 described with respect to FIG. 3. For example, removable layer 50b may release pillars 52a when subjected a solution including, but not limited to, water (e.g., de-ionized water), organic solvents, inorganic acids (e.g., dilute HF), basic solutions, and/or the like.

Functional material 34a (e.g. silicon) may be positioned adjacent to removable layer 50b. Adhesion layer 62b may be positioned adjacent to functional material 34a. During processing of patterned layer 46b (shown in FIG. 8B), adhesion layer 62b may help to minimize separation distortion by adhering patterned layer 46b to multilayer substrate 58b during separation of template 18 from patterned layer 46b.

Figure 8B:
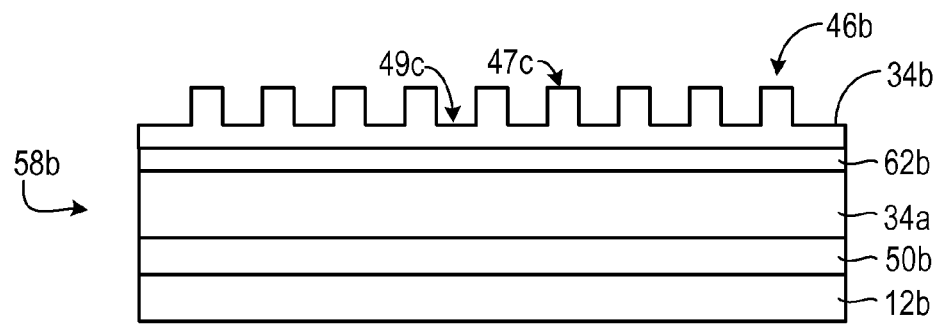

Referring to FIG. 8B, features (e.g., 47c and 49c) of patterned layer 46b may be formed on multilayer substrate 58b using template 18 as described in relation to system 10 and processes described with respect to FIGS. 1 and 2. In some cases, patterned layer 46b may be formed by other nanolithography techniques including, but not limited to, optical lithography, x-ray lithography, extreme ultraviolet lithography, scanning probe lithography, atomic force microscopic nanolithography, magneto lithography, and/or the like.

Figure 8C:
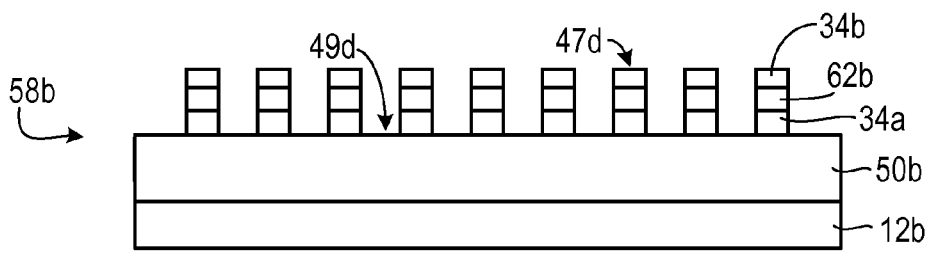

Referring to FIG. 8C, features (e.g., 47c and 49c, shown in FIG. 8B) may be etched in multilayer substrate 58b forming features (e.g., 47d and 49d) in removable layer 50b. Exemplary techniques include, but are not limited to, techniques described in U.S. Pat. No. 7,179,396 and U.S. Pat. No. 7,396,475, both of which are incorporated by reference herein. For example, portions may be removed using techniques including, but not limited to, blanket etching, chemical-mechanical planarization, and/or similar methods. For example, metal etchants may be used including, but not limited to, $Cl_2$, $BCl_3$, other chlorine-containing etchants, and/or the like. It should be noted that the metal etchants are not limited to chlorine-containing etchants. For example, some metals, such as tungsten, may be etched using fluorine-containing etchants. Additionally, features (e.g., 47d and 49d) may be formed by etching using an imprinting resist as a mask or by using a hard mask for pattern transfer. For example, features (e.g., 47d and 49d) may be formed by using a hard mask formed of materials including, but not limited to, Cr, silicon oxide, silicon nitride, and/or the like. Alternatively, silicon etchants may be used including, but not limited to, $CF_4$, $CHF_3$, $SF_6$, $Cl_2$, HBr, other fluorine-, chlorine-, and bromine-containing etchants, and/or the like. Additionally, features (e.g., 47d and 49d) may be etched using an imprint resist as a mask, a hard mask for pattern transfer, or the like. For example, features (e.g., 47d and 49d) may be etched using a hard mask formed of materials including, but not limited to, Cr, silicon oxide, silicon nitride, and/or the like.

Figure 8D:
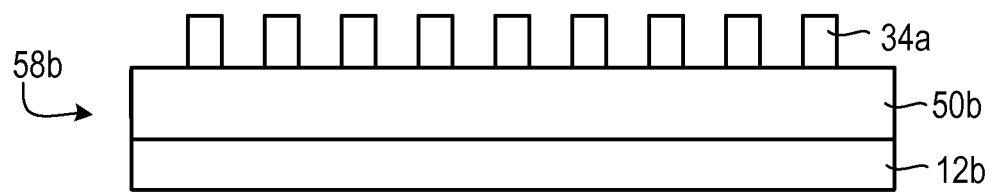
Figure 8E:
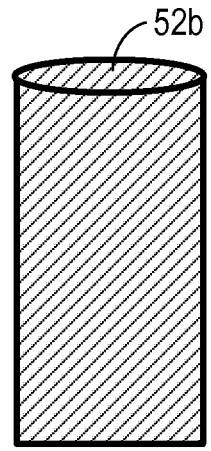

Referring to FIGS. 8C-8E, sacrificial material 34b used to form patterned layer 46b and adhesion layer 62b may be stripped from functional material 34a. Removable layer 50b may be subjected to a chemical process (e.g., HF dip) such that functional material 34a is removed from multilayer substrate 58 forming one or more pillars or nanoparticles 52b (i.e., functional nanoparticles).

Figure 9:
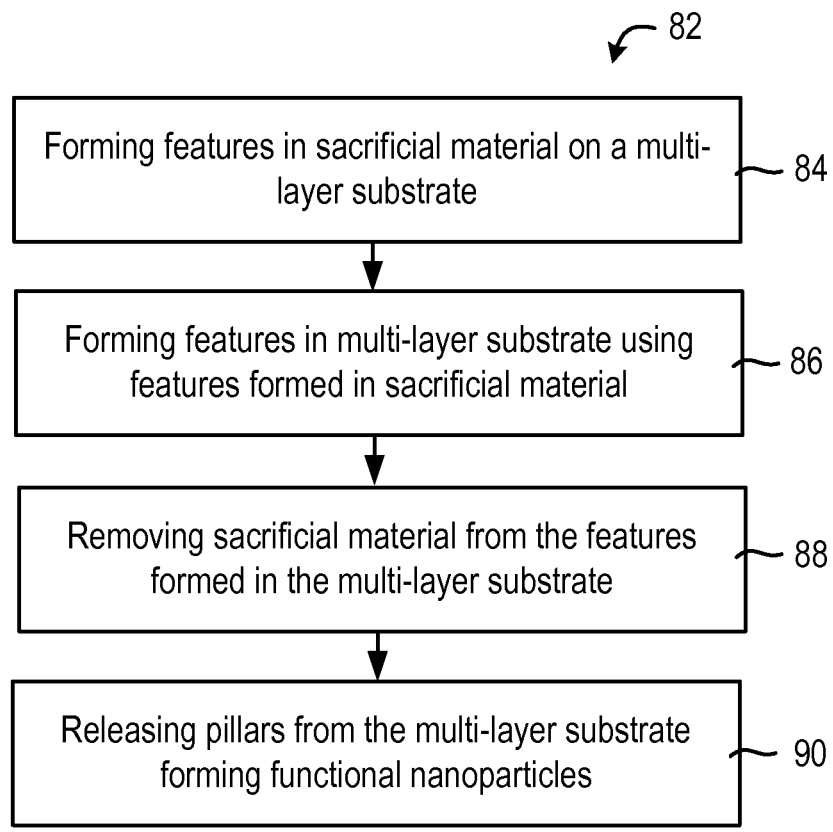
FIG. 9 is a flow chart showing steps in a method of forming pillars using nanoimprint lithography.

FIG. 9 illustrates a flow chart of a method 82 for forming pillars or nanoparticles 52a using an imprint lithography system. Formation of pillars 52a may include one or more lithography steps (e.g., nanoimprint lithography). In step 84, sacrificial material 34b may be patterned on a multilayer substrate 58b. For example, sacrificial material 34b may be patterned using a first imprint lithography process using a nanoimprint lithography template to provide patterned layer 46b having features 47c and 49c. In step 86, features 47c and 49c may be used to form features 47d and 49d in multilayer substrate, down to or including removable layer 50b. In step 88, functional material 34b may be removed from features 47d, leaving protrusions of functional material 34a extending from removable layer 54b. In step 90, pillars 52b are released from multilayer substrate 58b, for example, by dissolving removable layer 50b.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:
1. A nanoimprint lithography method comprising:
   forming a patterned layer on a multilayer substrate, the multilayer substrate comprising a removable layer, wherein the removable layer comprises a water-soluble, non-toxic polymer with functional groups selected from the group consisting of carboxyl groups, nitrogen-containing groups, epoxide groups, hydroxyl groups, and polyethylene oxide groups;
   etching the patterned layer and portions of the multilayer substrate including the removable layer to transfer fea- tures from the patterned layer into the removable layer, wherein the etched removable layer comprises exposed protrusions and recessions;

disposing a polymerizable material on the etched removable layer to fill the recessions and cover the protrusions of the etched removable layer;

solidifying the polymerizable material to form pillars of the polymerized material in the recessions of the removable layer and to form a layer of polymerized material over the removable layer;

removing a portion of the polymerized material to expose the protrusions of the etched removable layer; and releasing the pillars from the removable layer to form nanoparticles comprising the polymerized material.

2. The method of claim 1, wherein forming the patterned layer on the multilayer substrate comprises:

disposing a second polymerizable material on the multilayer substrate;

contacting the second polymerizable material with a nanoimprint lithography template; and solidifying the second polymerizable material to form the patterned layer on the multilayer substrate.

3. The method of claim 1, wherein solidifying the polymerizable material to form pillars of the polymerized material in the recessions of the removable layer and to form a layer of polymerized material over the removable layer comprises contacting the polymerizable material with a nanoimprint lithography template and exposing the polymerizable material to ultraviolet radiation through the nanoimprint lithography template.

4. The method of claim 1, wherein the polymerizable material disposed on the etched removable layer is a functional material.

5. The method of claim 4, wherein the functional material is biocompatible.

6. The method of claim 1, wherein the nanoparticles have a cross-sectional shape selected from the group consisting of round, triangular, and rectangular.

7. The method of claim 1, wherein releasing the pillars from the removable layer to form nanoparticles comprising the polymerized material comprises dissolving the removable layer.

8. The method of claim 1, wherein a dimension of the nanoparticles is less than 100 nm.

9. A nanoimprint lithography method comprising:

forming a patterned layer on a multilayer substrate, the multilayer substrate comprising:

a removable layer comprising a water-soluble, non-toxic polymer with functional groups selected from the group consisting of carboxyl groups, nitrogen-containing groups, epoxide groups, hydroxyl groups, and polyethylene oxide groups; and a functional layer comprising functional material;

etching portions of the patterned layer and portions of the multilayer substrate to expose at least a portion of the removable layer, wherein the etched multilayer substrate comprises multilayer protrusions capped with portions of the patterned layer;

removing the portions of the patterned layer from the multilayer protrusions to expose pillars comprising the functional material; and releasing the pillars from the removable layer to form nanoparticles comprising the functional material.

10. The method of claim 9, wherein forming the patterned layer on the multilayer substrate comprises:

disposing a polymerizable material on the multilayer substrate;

contacting the polymerizable material with a nanoimprint lithography template; and solidifying the polymerizable material to form the patterned layer on the multilayer substrate.

11. The method of claim 9, wherein the functional material is biocompatible.

12. The method of claim 9, wherein the nanoparticles have a cross-sectional shape selected from the group consisting of round, triangular, and rectangular.

13. The method of claim 9, wherein releasing the pillars from the removable layer to form nanoparticles comprising the functional material comprises dissolving the removable layer.

14. The method of claim 9, wherein a dimension of the nanoparticles is less than 100 nm.

* * * * *